US008698391B2

(12) United States Patent
Cok

(10) Patent No.: US 8,698,391 B2
(45) Date of Patent: Apr. 15, 2014

(54) CHIPLET DISPLAY WITH ORIENTED CHIPLETS AND BUSSES

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 1296 days.

(21) Appl. No.: 12/431,925

(22) Filed: Apr. 29, 2009

(65) Prior Publication Data
US 2010/0277440 A1 Nov. 4, 2010

(51) Int. Cl.
H05B 33/26 (2006.01)
(52) U.S. Cl.
USPC .............................. 313/505; 345/82; 345/204
(58) Field of Classification Search
USPC .............................. 313/498, 505; 345/82, 204
See application file for complete search history.

(56) References Cited

U.S. PATENT DOCUMENTS

| 4,769,292 | A |  | 9/1988  | Tang et al. |
|---|---|---|---|---|
| 5,061,569 | A |  | 10/1991 | Vanslydke et al. |
| 5,539,550 | A | * | 7/1996  | Spitzer et al. ................... 349/42 |
| 6,384,529 | B2 |  | 5/2002 | Tang et al. |
| 6,633,134 | B1 |  | 10/2003 | Kondo |
| 6,662,250 | B1 |  | 12/2003 | Peterson |
| 6,919,681 | B2 |  | 7/2005 | Cok et al. |
| 6,987,355 | B2 |  | 1/2006 | Cok |
| 7,230,594 | B2 |  | 6/2007 | Miller et al. |
| 7,271,472 | B2 |  | 9/2007 | Kuzmenka |
| 7,796,228 | B2 | * | 9/2010 | Kim et al. ..................... 349/149 |
| 2002/0053881 | A1 | * | 5/2002 | Odake et al. ................ 315/169.1 |
| 2004/0140763 | A1 | * | 7/2004 | Buchwalter et al. .......... 313/506 |
| 2006/0017375 | A1 | * | 1/2006 | Noguchi et al. .............. 313/504 |
| 2006/0055864 | A1 |  | 3/2006 | Matsumura et al. |
| 2007/0057263 | A1 |  | 3/2007 | Kahen |

OTHER PUBLICATIONS

A novel use of MEMs switches in driving AMOLED, by yoon, Lee, uyang and Jang, digest of Technical Papers of the society for Information display, 2008, 3.4, p. 13.
IPC-2221A, May 23, p. 65-67.

* cited by examiner

Primary Examiner — Andrew Coughlin
(74) Attorney, Agent, or Firm — Global OLED Technology LLC

(57) ABSTRACT

A display device includes a substrate having a display area; two or more column-driver chiplets having connection pads, each column-driver chiplet having a long axis and located over the substrate in the display area, the long axis of each column-driver chiplet oriented in a row direction; one or more row-driver chiplets having connection pads, each row-driver chiplet having a long axis and located over the substrate in the display area, the long axis of each row-driver chiplet oriented in a column direction different from the row direction; and a first common buss extending over the display area in the row direction connected to a connection pad on each of the row-driver chiplets, the first common buss further including one or more electrically connected first buss portions oriented in the column direction, each first buss portion electrically connected to a connection pad of a respective column-driver chiplet.

17 Claims, 11 Drawing Sheets

US 8,698,391 B2

CHIPLET DISPLAY WITH ORIENTED CHIPLETS AND BUSSES

CROSS REFERENCE TO RELATED APPLICATIONS

Reference is made to commonly-assigned, co-pending U.S. patent applications: Ser. No. 12/371,666 filed Feb. 16, 2009, entitled "Chiplet Display Device with Serial Control" to Cok Ser. No. 12/372,132 filed Feb. 17, 2009, entitled "Chiplet Driver Pairs for Two-Dimensional Display" to Cok et al and Ser. No. 12/426,986 filed Apr. 21, 2009 entitled "CHIPLET DISPLAY WITH MULTIPLE PASSIVE-MATRIX CONTROLLERS" to Cok, he disclosures of which are incorporated herein.

FIELD OF THE INVENTION

The present invention relates to display devices having a substrate with distributed, independent chiplets for controlling a pixel array.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light to represent each image element. As used herein, pixels and sub-pixels are not distinguished and refer to a single light-emitting element. A variety of flat-panel display technologies are known, for example plasma displays, liquid crystal displays, and light-emitting diode (LED) displays.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 entitled, "Stacked OLED Display having Improved Efficiency" by Cok. It is also known to employ a white sub-pixel that does not include a color filter, for example, as taught in U.S. Pat. No. 6,919,681 entitled, "Color OLED Display with Improved Power Efficiency" by Cok et al. U.S. Pat. No. 7,230,594 issued Jun. 12, 2007 to Miller, et al., among others, discloses a design employing an unpatterned white emitter together with a four-color pixel comprising red, green, and blue color filters and sub-pixels and an unfiltered white sub-pixel to improve the efficiency of the device.

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate with light-emitting material formed between the row and column electrodes; the overlapping intersections between the row and column electrodes form the electrodes of a light-emitting diode. External driver chips then sequentially supply current to each row (or column) while the orthogonal column (or row) supplies a suitable voltage to illuminate each light-emitting diode in the row (or column). Therefore, a passive-matrix design employs 2n connections to produce $n^2$ separately controllable light-emitting elements. However, only n light-emitting elements can be activated with different currents at once. A passive-matrix drive device is also limited in the number of rows (or columns) that can be included in the device since the sequential nature of the row (or column) driving creates flicker. If too many rows are included, the flicker can become perceptible. Moreover, the currents necessary to drive an entire row (or column) in a display can be problematic since the power required for the non-imaging pre-charge and discharge steps of PM driving become dominant as the area of the PM display grows. These problems limit the physical size of a passive-matrix display.

In an active-matrix device, active control elements are formed of thin films of semiconductor material, for example amorphous or poly-crystalline silicon, coated over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the luminance of the sub-pixel. Each light-emitting element typically employs an independent control electrode and an electrode electrically connected in common. Control of the light-emitting elements is typically provided through a data signal line, a select signal line, a power connection and a ground connection. Active-matrix elements are not necessarily limited to displays and can be distributed over a substrate and employed in other applications requiring spatially distributed control. The same number of external control lines (except for power and ground) can be employed in an active-matrix device as in a passive-matrix device. However, in an active-matrix device, each light-emitting element has a separate driving connection from a control circuit and is active even when not selected for data deposition so that flicker is eliminated.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials. In such active-matrix designs, each light-emitting element requires a separate connection to a driving circuit.

Employing an alternative control technique, Matsuinura et al describe crystalline silicon substrates used for driving LCD displays in U.S. Patent Application Publication No. 2006/0055864. The application describes a method for selectively transferring and affixing pixel-control devices made from first semiconductor substrates onto a second planar display substrate. Wiring interconnections within the pixel-control device and connections from busses and control electrodes to the pixel-control device are shown.

Since a conventional passive-matrix display design is limited in size and number of light-emitting elements, and an active-matrix design using TFTs has lower electrical performance and complex substrates, there is a need for an improved control method and display structure for display devices that overcomes these problems.

SUMMARY OF THE INVENTION

In accordance with the present invention, there is provided a display device comprising:

a) a substrate having a display area;

b) two or more column-driver chiplets having connection pads, each column-driver chiplet having a long axis and located over the substrate in the display area, the long axis of each column-driver chiplet oriented in a row direction;

c) one or more row-driver chiplets having connection pads, each row-driver chiplet having a long axis and located over the substrate in the display area, the long axis of each row-driver chiplet oriented in a column direction different from the row direction; and d) a first common buss extending over the display area in the row direction connected to a connection pad on each of the row-driver chiplets, the first common buss further including one or more electrically connected first buss portions oriented in the column direction, each first buss portion electrically connected to a connection pad of a respective column-driver chiplet.

Advantages

An advantage of the present invention is that, by providing row- and column-driver chiplets having different orientations, the display area required for busses is reduced so that the emissive area is increased and the buss routing improved. A further advantage is that the busses can be routed in a single layer, reducing manufacturing steps.

Figure 1:
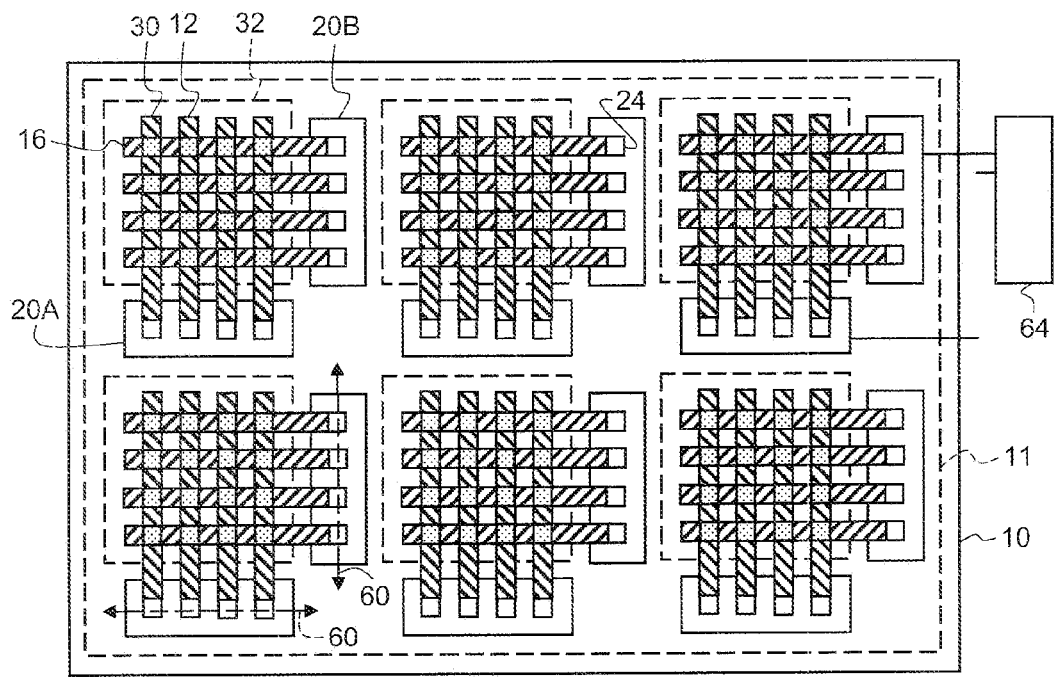
FIG. 1 is a plan view of a substrate with six pixel groups, each pixel group including a separate row-driver chiplet and a separate column-driver chiplet according to an embodiment of the present invention.

Because the various layers and elements in the drawings have greatly different sizes, the drawings are not to scale.

DETAILED DESCRIPTION OF THE INVENTION

Figure 11:
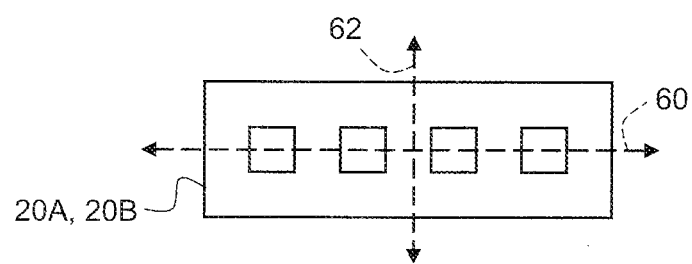
FIG. 11 is a plan view of a chiplet with the long axis indicated according to an embodiment of the present invention.

Referring to FIG. 1, in one embodiment of the present invention, a display device includes a substrate 10 having a display area 11. Two or more column-driver chiplets 20A having connection pads 24 are located over the substrate 10 in the display area 11 and one or more row-driver chiplets 20B having connection pads 24 are also located over the substrate 10 in the display area 11. As shown in FIG. 11, the column- and row-driver chiplets 20A, 20B each have a long axis 60 and a short axis 62. Typically, column and row-driver the chiplets 20A, 20B are rectangular with two opposing sides longer than the other two sides, making a physically high-aspect ratio chiplet with a long dimension and a short dimension. The long axis 60 of the chiplet is in the long dimension; the short axis 62 of the chiplet is in the short dimension. The long axis 60 of each column-driver chiplet 20A is oriented in a row direction. The long axis 60 of each row-driver chiplet 20B is oriented in a column direction different from the row direction. In one embodiment of the present invention, the row and column directions are orthogonal. In another embodiment of the present invention, the display area 11 is rectangular and the row direction is parallel to one side of the display area 11 and the column direction is parallel to a side of the display area 11 adjacent to the one side.

Figure 2:
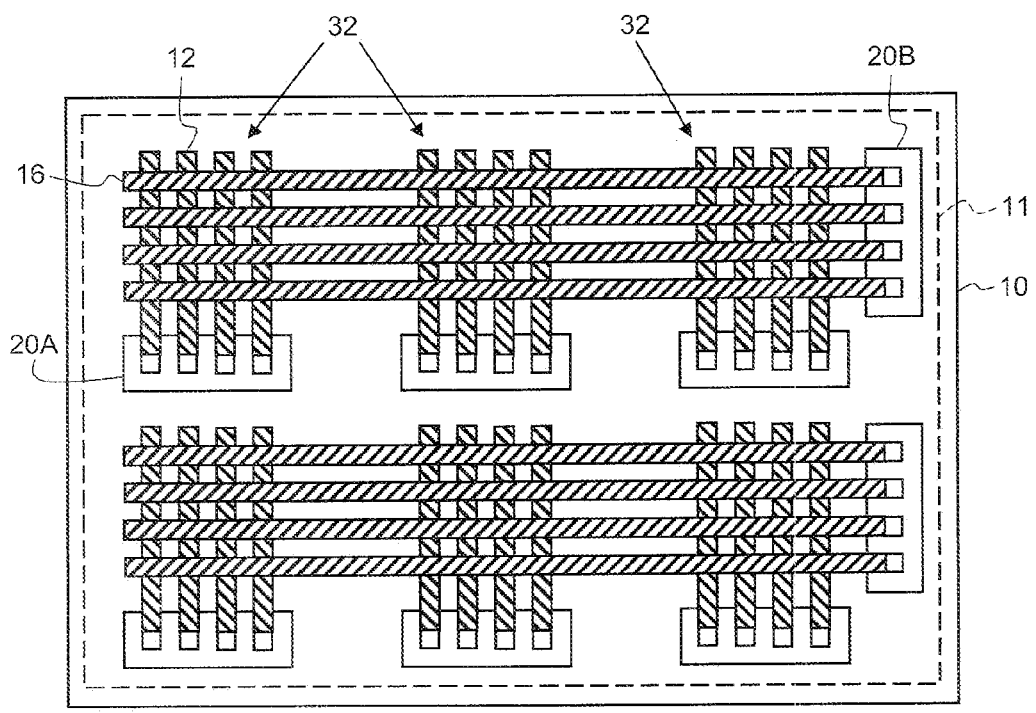
FIG. 2 is a plan view of a substrate with six pixel groups, each pixel group including a separate column-driver chiplet, three of the pixel groups sharing common row electrodes and a row-driver chiplet, according to an embodiment of the present invention.
Figure 3:
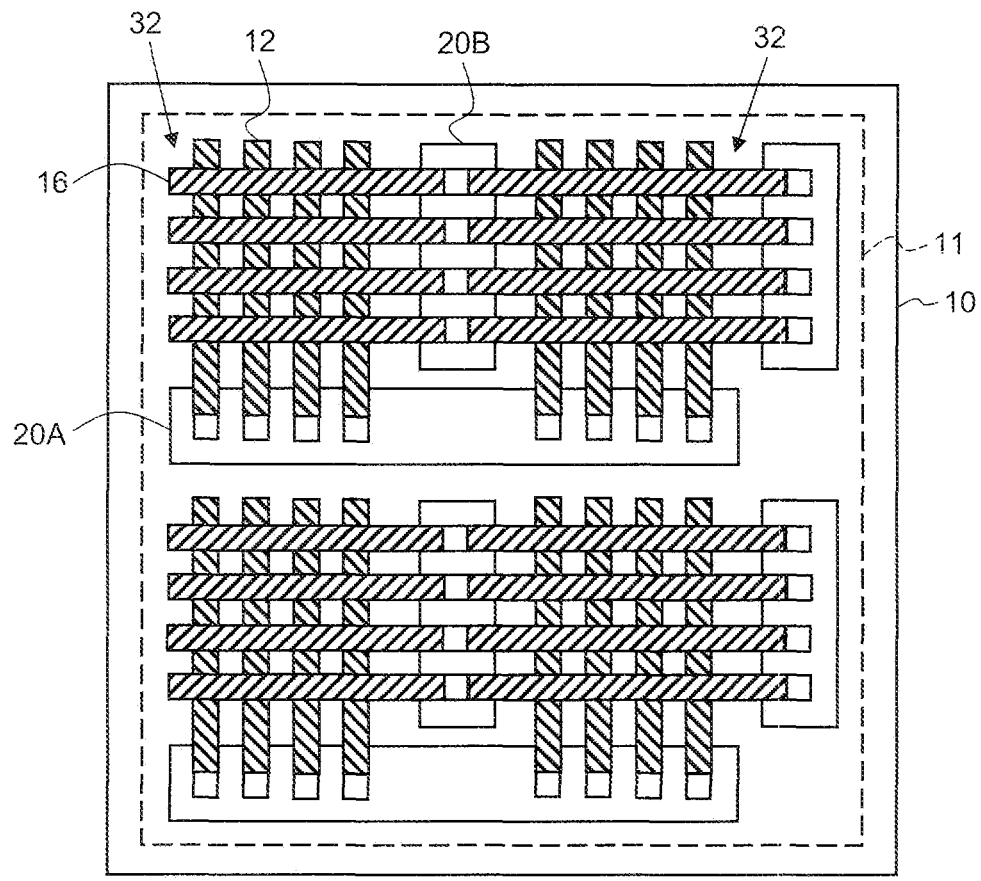
FIG. 3 is a plan view of a substrate with four pixel groups, each pixel group including a separate row-driver chiplet and pairs of pixel groups sharing a row-driver chiplet according to an embodiment of the present invention.

A plurality of row electrodes 16 is formed over the substrate 10 in the display area 11 extending in a row direction and a plurality of column electrodes 12 is formed over the substrate 10 in the display area 11 extending in a column direction different from the row direction. The row and column directions are arbitrarily designated and can be exchanged. The row and column electrodes 16, 12 overlap to form pixels 30. Typically, the row direction is orthogonal to the column direction and the pixels 30 form a regular array over the substrate 10. In various embodiments of the present invention, row and column electrodes 16, 12 can be broken up into mutually exclusive groups to form mutually exclusive, separately controllable groups 32 of pixels 30. Each pixel group 32 can be driven by one column-driver chiplet 20A and one row-driver chiplet 20B, as shown in FIG. 1. The column-driver chiplets 20A and row-driver chiplets 20B can implement a passive-matrix controlled array of pixels 30 in each pixel group 32. In this disclosure, the row electrodes 16 are presumed to be common and connected to a row-driver chiplet 20B. Likewise, the column electrodes 12 are independent and connected to a column-driver chiplet 20A. Again, the actual designations are arbitrary and row and column drivers and row and column electrodes can be exchanged in other embodiments of the present invention. In an alternative embodiment of the present invention, pixel groups 32 can share common row electrodes 16. One row-driver chiplet 20B can be employed to drive the row, as shown in FIG. 2, so that the device employs more column-driver chiplets 20A than row-driver chiplets 20B. In a different embodiment of the present invention, pixel groups 32 can share row electrodes 16 and row-driver chiplets 20B, as shown in FIG. 3, so that the device employs more row-driver chiplets 20B than column-driver chiplets 20A and the row-driver chiplets 20B that share row electrodes are connected in parallel.

The column- and row-driver chiplets 20A and 20B are electrically interconnected through busses. Busses are electrical conductors formed over the substrate 10 that electrically connect connection pads 24 on the various chiplets 20A, 20B in the display area 11 to external devices, such as controllers 64 (shown in FIG. 1). Circuitry in the chiplets 20A, 20B can then electrically connect to the connection pads 24 to operate the device. The busses can be formed, for example, by evaporating or sputtering metal or metal oxides, for example aluminum, silver or other metals or metal alloys, or indium tin oxide, aluminum zinc oxide, or other metal oxides, to conduct current. The busses can be patterned, for example, by using masks or photolithographic methods known in the art. Busses can each be individual conductors (e.g. wires) or groups of conductors and can conduct, for example, control signals, power signals, or ground signals.

Figure 4:
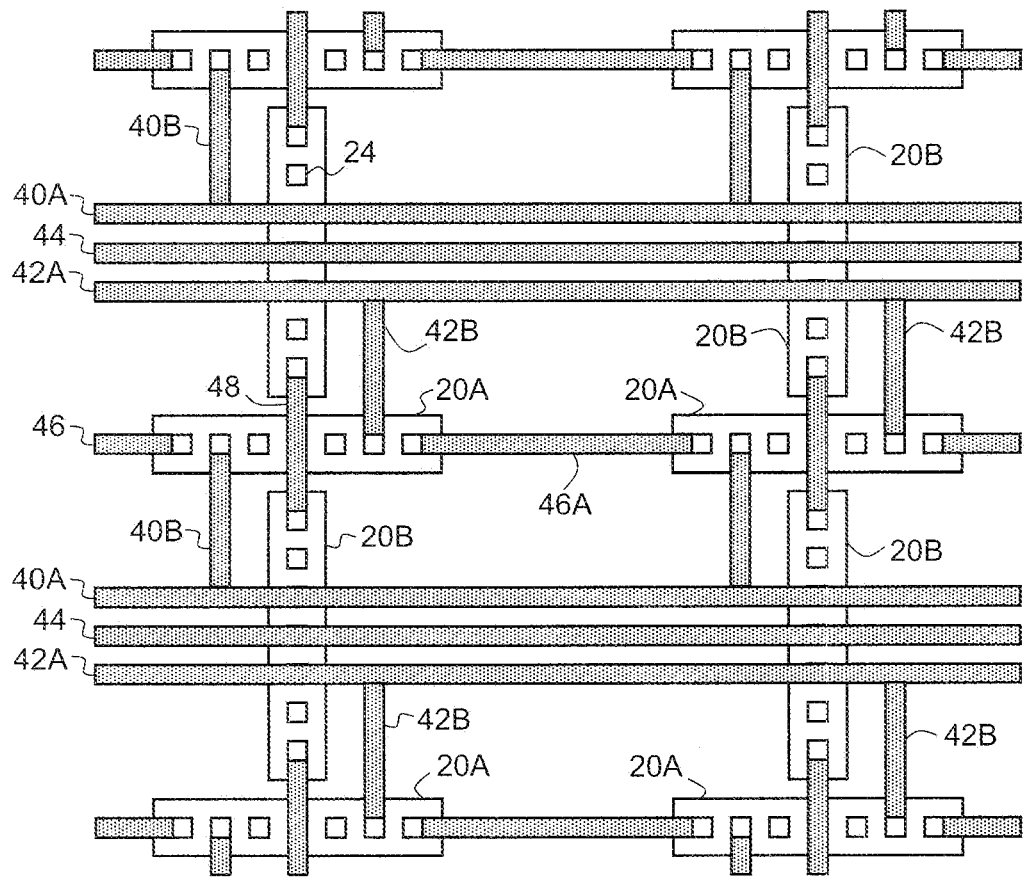
FIG. 4 is a schematic of row and column-driver chiplets with common busses and pass-through busses according to an embodiment of the present invention.

Turning to FIG. 4, a variety of busses are illustrated in a variety of embodiments useful with the present invention. In FIG. 4, common busses that extend continuously over the display area are formed in the row direction, parallel to the long axis of column-driver chiplets 20A. An additional row-driver buss 44 extending over the display area in the row direction is connected to a connection pad 24 on each of the row-driver chiplets 20B in a row. Such row-driver busses 44 electrically connect each of the row-driver chiplets 20B in a row but are not directly connected to column-driver chiplets 20A and hence are not common busses.

Figure 12:
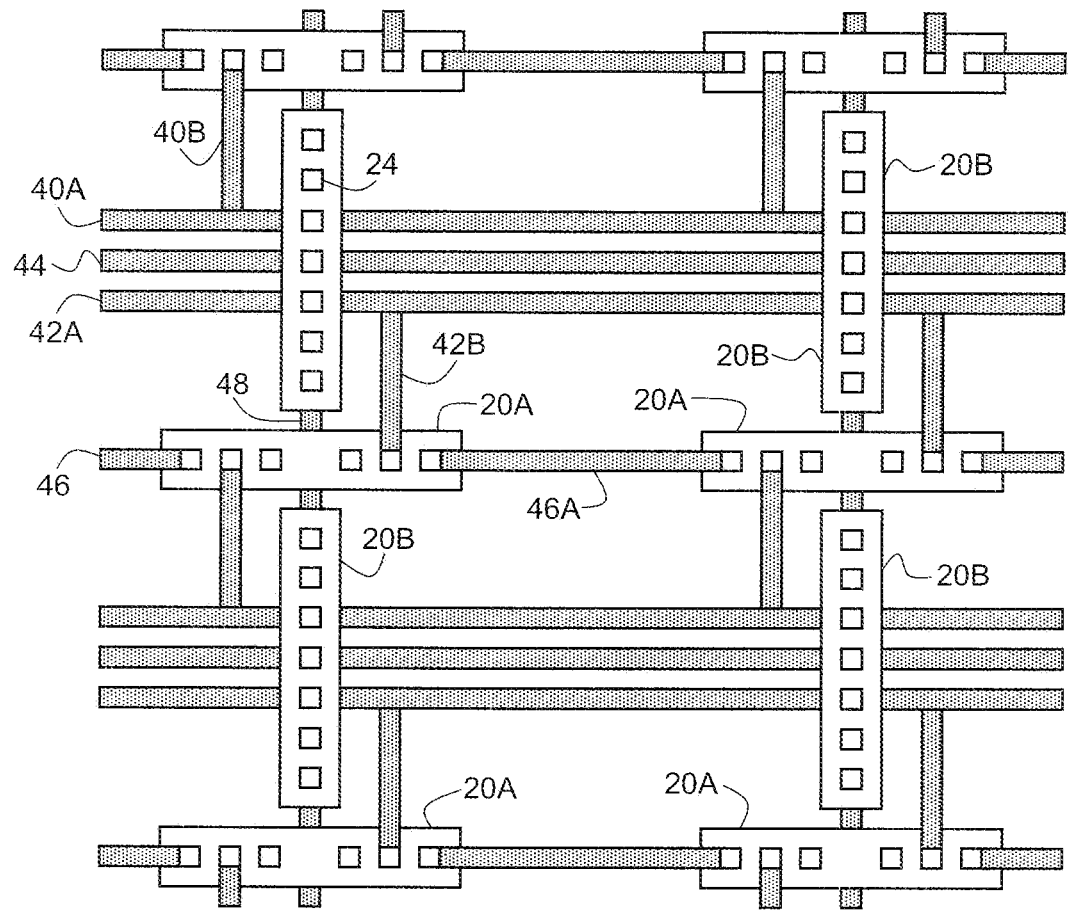
FIG. 12 is a schematic of row and column-driver chiplets with common busses and pass-through busses according to an alternative embodiment of the present invention.

A first common buss 40A extending over the display area in the row direction is electrically connected to a connection pad 24 on the top of each of the column- and row-driver chiplets 20A, 20B, the first common buss 40A passing over each of the row-driver chiplets 20B in the row direction. Alternatively, as shown in FIG. 12, the first common buss 40A can pass under each of the row-driver chiplets 20B and connect to a connection pad 24 located underneath the chiplet. The first common buss 40A can be electrically connected to the row-driver chiplet 20B where the buss 40A passes over or under the row-driver chiplet 20B through a connection pad 24. Returning to FIG. 4, the first common buss 40A further includes one or more first buss portions 40B oriented in the column direction and electrically connected to the first common buss 40A, each first buss portion 40B electrically connected to a connection pad 24 of each of the column-driver chiplets 20A. A second common buss 42A, similar to the first common buss 40A extending over the display area in the row direction is electrically connected to a connection pad 24 on each of the row-driver chiplets 20A, 20B, the second common buss 42A passing over or under each of the row-driver chiplets 20B in the row direction. The second common buss 42A can be connected to the row-driver chiplet 20B where the buss 42A passes over or under the row-driver chiplet 20B through a connection pad 24. The second common buss 42A further includes one or more second buss portions 42B oriented in the column direction and electrically connected to the second common buss 42A, each second buss portion 42B electrically connected to a connection pad 24 of each of the column-driver chiplets 20A from a side of the column-driver chiplet 20A opposite to the side of the column-driver chiplet 20A to which the first buss portion 40B is electrically connected. Hence, one common buss (e.g. 40A, 40B) is electrically connected to a column-driver chiplet 20A on one side of a row-driver chiplet 20B and another common buss (e.g. 42A, 42B) is electrically connected to different column-driver chiplet 20A on the opposite side of the row-driver chiplet 20B. A common buss is one that is directly connected to every chiplet. The common busses (e.g. 40A, 42A) can be continuously formed over the display area. Power and ground signals are especially well suited for the common busses, since the buss wires typically have the highest conductivity and can conduct the greatest amount of current without resistive heating in the buss. Control or clock lines can also be, but are not necessarily, connected to every chiplet. Row-driver busses 44 can be located between the first and second common busses 40A, 42A. Row-driver busses 44 can also be continuous over the display area, but can also be indirectly electrically connected through the chiplet to other connection pads 24 and chiplets. This arrangement permits the common busses to directly connect to every chiplet and the row-driver busses 44 to connect to row-driver chiplets 20B in a common layer, for example a wiring, buss, or metal layer.

It is an advantage of the present invention that the busses can be simpler to route and formed in a single, common layer, and still directly connect each of the chiplets with common busses. Such a common layer reduces manufacturing steps. Direct buss connections provide improved conductivity. Additional busses can be formed in the common layer and electrically interconnect to the row-driver chiplets in various ways.

In order to facilitate connection pad 24 electrical connections to the row and column electrodes 16, 12 in a symmetric manner, in one embodiment of the present invention, the first common buss 40A or the second common buss 42A is connected to a central connection pad on a row-driver chiplet. The row-driver buss 44, if present, can also be connected to a central connection pad on a chiplet 20B. If there are an odd number of connection pads in a row, the central connection pad is the connection pad in the middle of the row of connection pads 24 on a chiplet, (e.g. the fourth connection pad in a set of seven connection pads). Alternatively, if there is an even number of connection pads in a chiplet, a central connection pad is either of the two connection pads closest to the middle of the row of connection pads 24 on a chiplet (e.g. connection pads four and five in a set of eight connection pads). The drawings of the present invention illustrate a single row of connection pads in each chiplet, but the invention is not limited to such an embodiment. Multiple rows of connection pads, for example two rows, can be employed. A central connection pad is then either of the pads in the middle, or closest to the middle, of the chiplet in the long direction of the chiplet. In an embodiment of the present invention, the row-driver buss 44 is located between the first and second common busses 40A and 42A to facilitate the connection of the first and second common busses 40A, 42A to the column-driver chiplets 20A and enable the busses to be formed in a single layer.

According to various embodiments of the present invention, other busses can be formed in the display area. A pass-through buss is a buss formed over the substrate that connects to a first connection pad on a chiplet, passes through the chiplet to a second connection pad, and then is reconnected to a buss line formed over the substrate. Hence, a pass-through buss includes a series of buss segments, connection pads, and chiplet connections forming an electrically continuous buss having different physical segments. According to an embodiment of the present invention, a first pass-through buss 46 extends in a row direction over the display area, connects to a column-driver chiplet 20A at a first connection pad 24, passes through the column-driver chiplet 20A and connects to a second connection pad 24 of a column-driver chiplet 20A to another pass-through buss segment 46A. The pass-through buss 46 can then continue over the substrate 10 to another column-driver chiplet 20A and pass through it. Similarly, a second pass-through buss 48, extends in a column direction over the display area 11, connects to a row-driver chiplet 20B, at a first connection pad 24, pass through the row-driver chiplet 20B and connects to a second connection pad 24 of the row-driver chiplet 20B. Pass-through busses permit busses to extend across the display area in a direction orthogonal to other busses, in particular to the common busses that are continuous in the display area 11. Pass-through buss 48, for example, routes signals over the display area in a direction orthogonal to the first and second common busses 40A, 42A. Pass-through busses (e.g. 46, 48) can also connect to a chiplet whose long axis is oriented orthogonal to the direction of the pass-through buss. For example, pass-through buss 48 can connect to a connection pad 24 on a chiplet 20A, as shown in FIG. 4. The pass-through busses (e.g. 46, 48) also enable an electrical connection to all of the busses; that is the pass-through busses 46, 48 can electrically connect every chiplet to a common signal. For example, pass-through buss 48 can electrically connect through a connection pad 24 on a chiplet 20A to pass-through buss 46. Alternatively, as shown in FIG. 12, a pass-through buss 46 can emerge from a first chiplet, pass over or under a second chiplet without connecting to it, and then connect to a third chiplet on the other side. For example, pass-through buss 48 can pass over chiplet 20A (without connecting to it) and connect to row-driver chiplets 20B on either side of the chiplet 20A, eliminating the need for a corresponding connection pad on the column-driver chiplet 20A.

Figure 5:
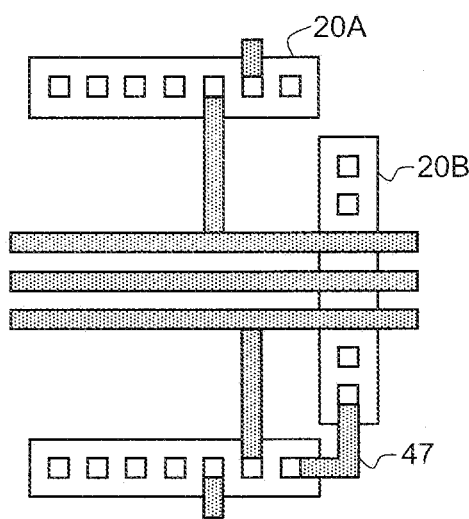
FIG. 5 is a schematic of row and column-driver chiplets with common busses according to an alternative embodiment of the present invention.

Referring to FIG. 5, column- and row-driver chiplets 20A, 20B can also be connected without a pass-through buss. For example, a signal in chiplet 20A can connect to row-driver chiplet 20B (or vice versa) with an electrical chiplet connection 47. The electrical chiplet connection 47 can be straight or have a non-straight, rectilinear path, or a curved path. The centers of column- and row-driver chiplets 20A, 20B can be oriented in a common line (as shown in FIG. 4). Alternatively, the center of the column-driver chiplets can be offset from the center of the row-driver chiplets in the horizontal direction, as shown in FIGS. 1, 2, 3, and 5.

Figure 6A:
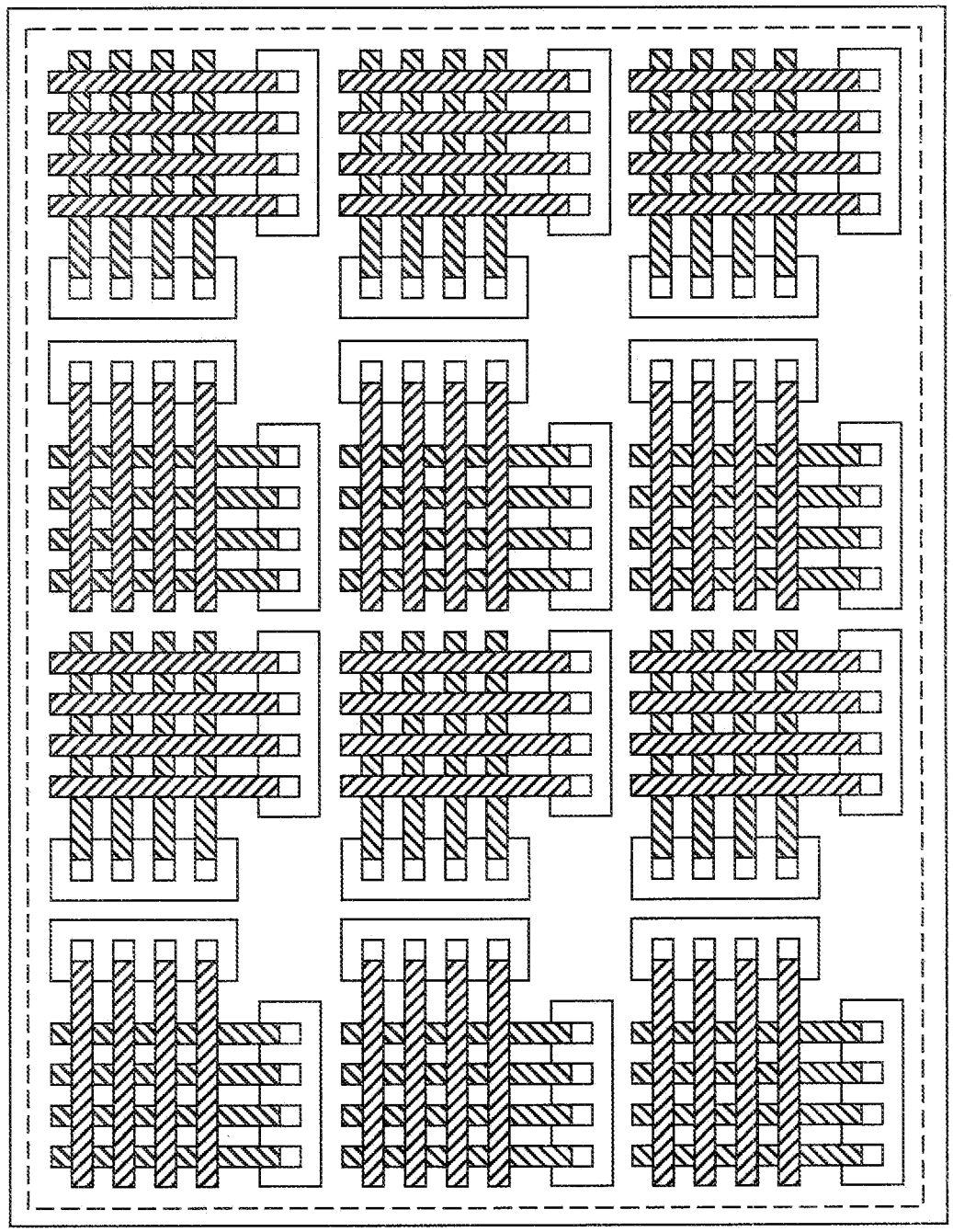
FIG. 6A is a plan view of a substrate with twelve pixel groups, each pixel group including a separate row-driver chiplet and a separate column-driver chiplet arranged in alternating mirror image layouts in the vertical direction according to an embodiment of the present invention.
Figure 6B:
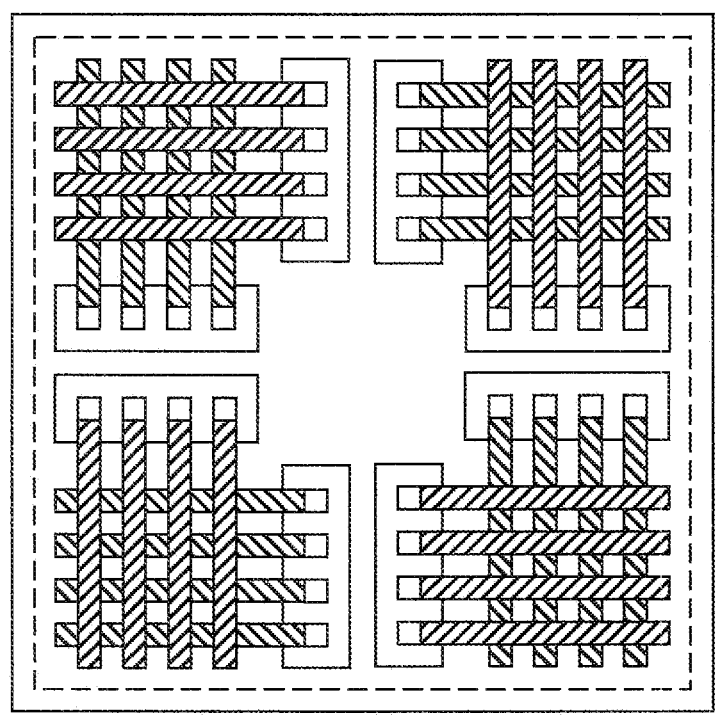
FIG. 6B is a plan view of a substrate with four pixel groups, each pixel group including a separate row-driver chiplet and a separate column-driver chiplet arranged in alternating mirror image layouts in the vertical and horizontal directions according to an embodiment of the present invention.
Figure 7:
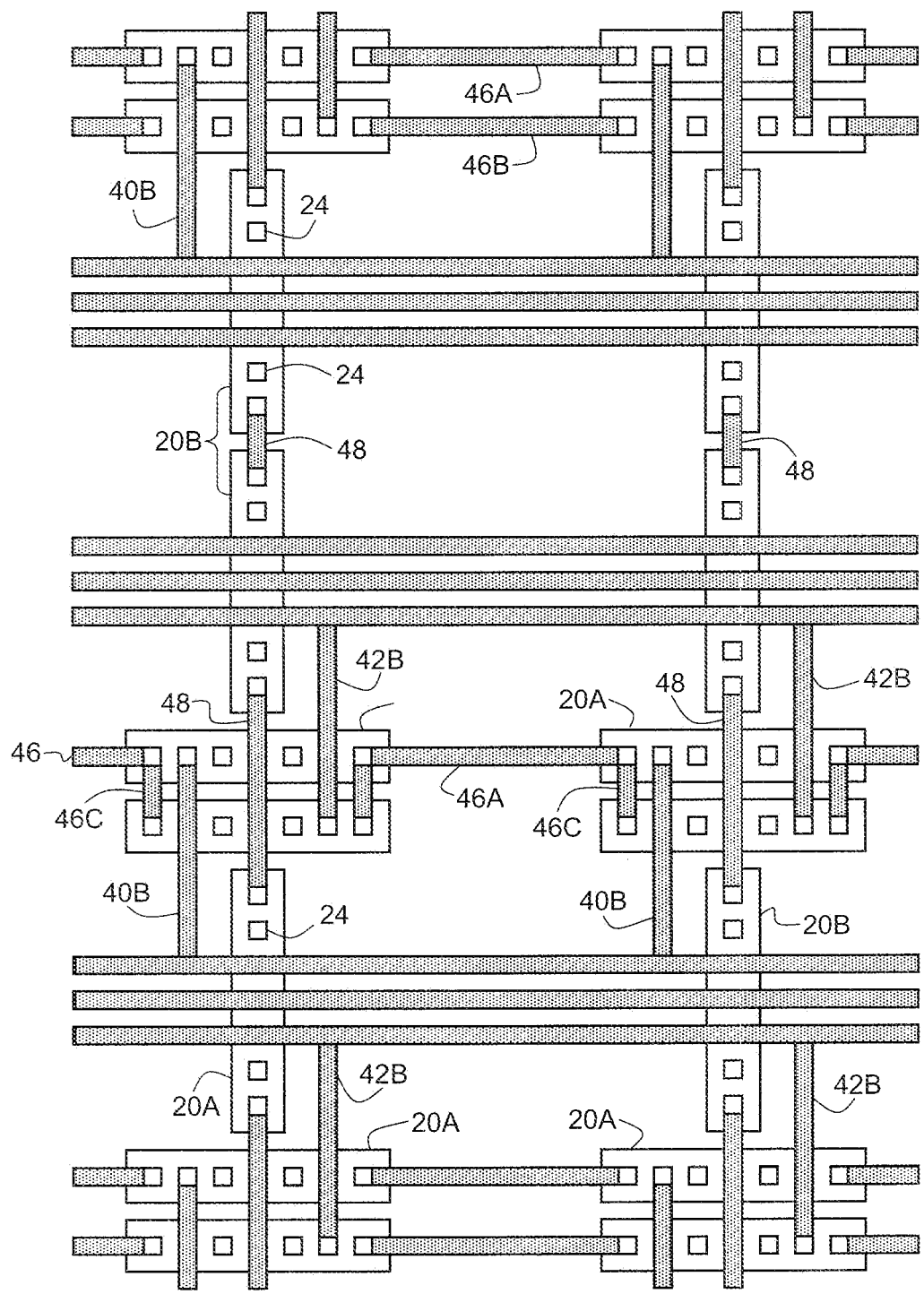
FIG. 7 is a schematic of row and column-driver chiplets with common busses and pass-through busses as arranged in FIG. 6A according to an embodiment of the present invention.

In one embodiment of the present invention, the column-driver chiplets 20A are regularly distributed in a regular array, as are the row-driver chiplets 20B, for example as shown in FIGS. 1, 2, and 3. In an alternative embodiment, alternating groups of pixels and their controlling chiplets are formed as mirror images of each other, in either the row or the column directions, or both. Referring to FIG. 6A, for example, the second row of pixel groups is a mirror image of the first row. Likewise, the fourth row of pixel groups and their controlling chiplets are mirror imaged from the third row. Referring to FIG. 6B, pixel groups and chiplet controllers in both rows and columns are formed as mirror images in alternating rows and alternative columns. FIG. 7 is a more detailed illustration of the buss layout for pixel groups that are mirror images of the neighboring pixel groups in the column direction, corresponding to FIG. 6A. In such an arrangement, the pass-through busses in the column direction (e.g. pass-through buss 48) can connect to two column-driver chiplets 20A between each row-driver chiplet 20B or can pass over or under two column-driver chiplets 20A between each row-driver chiplet 20B. Likewise, the first and second common buss portions 40B, 42B can each be connected to two chiplets 20A. Pass-through buss 46 includes buss segments 46A, 46B connected between chiplets to connection pads 24. In one embodiment of the present invention, separate buss segments 46A, 46B are employed between the chiplets (as shown at the top of the figure) for two pass-through busses 46. In another embodiment, one buss segment 46A is employed and the neighboring chiplets share a pass-through buss through short, inter-chiplet connections 46C.

Forming pixel groups in alternating mirror images is one way to address potential problems with uniformity. Because the row and column electrodes are not perfectly conducting, there will be some voltage drop in the row and column electrodes resulting in reduced luminance of pixels farther from the driving chiplets. By forming pixel groups and chiplets in alternating mirror images, no pixel furthest from a chiplet is located next to a pixel closest to a chiplet. Therefore, the perceptibility of changes in pixel luminance due to voltage drop in row or column electrodes is reduced since luminance changes will be more gradual and no brighter pixel will be immediately neighboring a dimmer pixel.

An external controller 64 (FIG. 1) provides signals on the common busses 42A and pass-through busses 46 to the column- and row-driver chiplets (20A, 20B). The column- and row-driver chiplets (20A, 20B) include circuitry to provide current to the row and column electrodes 16, 12. Current flows through light-emitting material 14 (FIGS. 8A, 8B) formed between the row and column electrodes 16, 12 causing the light-emitting material 14 to emit light. The controller 64 and column- and row-driver chiplets (20A, 20B) provide current to each electrode row 16 sequentially while data are provided on each column electrode 12, so that one row of pixels 30 in each pixel group 32 emits light simultaneously according to the current provided by the column electrodes 12. Each row of pixels 30 in each pixel group 32 should emit light bright enough and often enough to prevent flicker and provide a perceptible image on the pixels 30 in the display 11.

In an embodiment of the present invention, the row and column electrodes 16, 12 can be formed in separate layers and each pixel group 32 can have passive-matrix control controlled by row-driver and column-driver chiplets corresponding to column-driver and row-driver chiplets 20A and 20B.

According to the present invention, the pixels 30 formed by the overlap of the row and column electrodes 16, 12 are divided into pixel groups 32 controlled by separate column-driver chiplets 20A. Row-driver chiplets 20B can be shared, as can row electrodes 12, between pixel groups 32.

Figure 9:
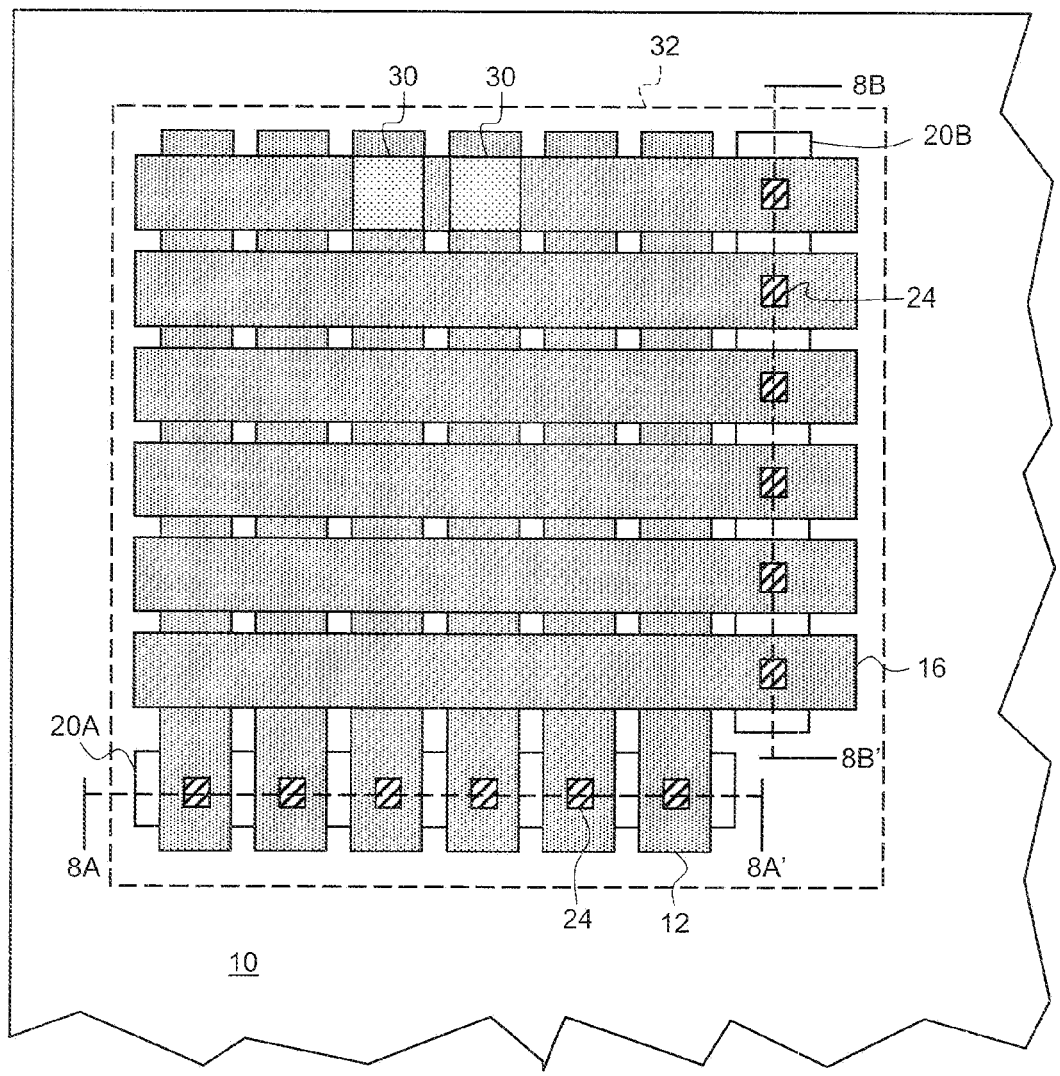
FIG. 9 is a plan view of a substrate portion with a pixel group, group row and column electrodes, a row-driver chiplet, and a column-driver chiplet according to an embodiment of the present invention.

A more detailed illustration of the row and column electrodes 16, 12 is found in FIG. 9. Row electrodes 16 and column electrodes 12 formed on a substrate 10 overlap to form pixels 30 defining a pixel group 32. A column-driver chiplet 20A electrically connects to the column electrodes 12 through connection pads 24 formed on the column-driver chiplet 20A. In this embodiment, the row driver is a row-driver chiplet 20B electrically connected to the row electrodes 16 through connection pads 24 formed on the row-driver chiplet 20B.

Figure 8A:
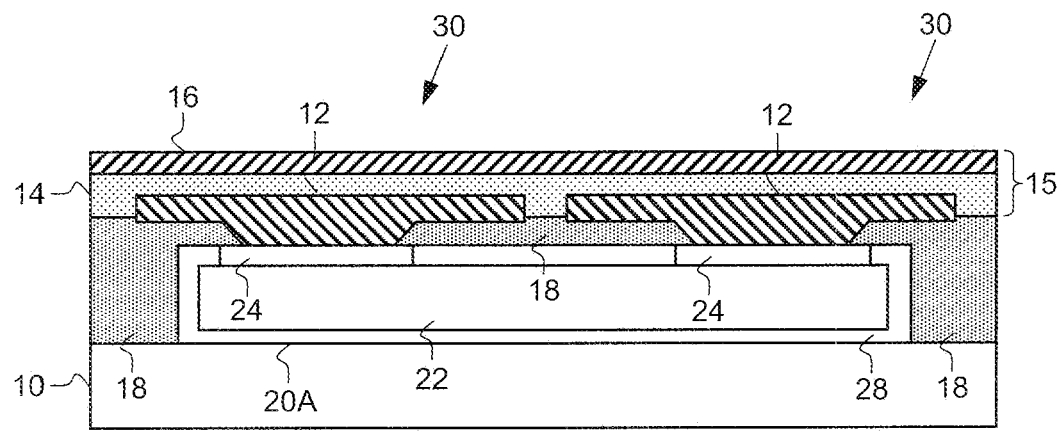
FIG. 8A is a partial cross section of a row-driver chiplet according to an embodiment of the present invention.
Figure 8B:
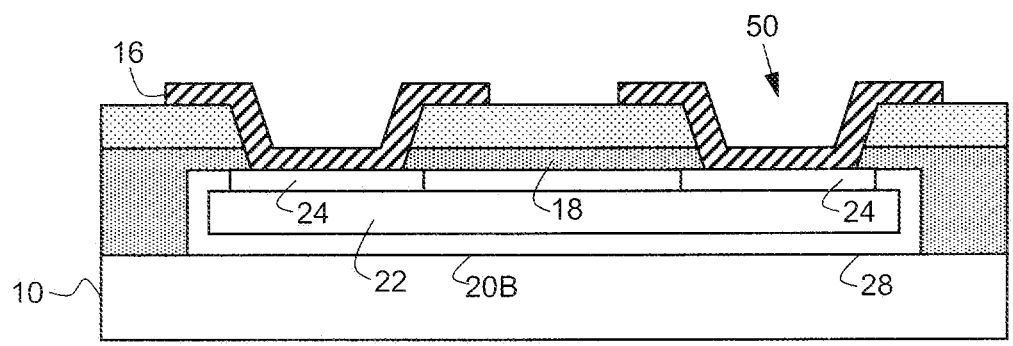
FIG. 8B is a partial cross section of a column-driver chiplet according to an embodiment of the present invention.

FIG. 8A is a cross section 8A, 8A' of an embodiment of the device shown in FIG. 9. Referring to FIG. 8A, a column-driver chiplet 20A having a chiplet substrate 28 separate from the display substrate 10 is adhered to the substrate 10 and buried with adhesion layer 18. The column-driver chiplet 20A includes circuitry 22. Column-driver chiplets 20A can have different circuitry than row-driver chiplets 20B. For example, column-driver chiplets 20A can implement column drivers and row-driver chiplets 20B (FIG. 8B) can implement row drivers. Column electrodes 12 are electrically connected to connection pads 24 formed on the chiplet 20A. Light-emitting material 14 is located over the column electrodes 12 and row electrodes 16 formed over the light-emitting material 14. (A row electrode 16 is shown over the chiplet 20A although the corresponding row electrode is omitted from FIG. 9 for clarity.) The light-emitting material 14 can include multiple layers of light-emitting material 14 as well as various charge-control layers as are known in the organic and inorganic light-emitting diode art. The electrodes 12, 16 and light-emitting material 14 form a light-emitting diode 15. FIG. 8B is a cross section 8B, 8B' of an embodiment of the device shown in FIG. 9. Referring to FIG. 8B, a row-driver chiplet 20B having a separate chiplet substrate 28 is adhered to a substrate 10 and buried with adhesion layer 18. The row-driver chiplet 20B includes circuitry 22 that can be different from the circuitry of column-driver chiplet 20A. Row electrodes 16 are electrically connected to connection pads 24 formed on the row-driver chiplet 20B through vias 50. The areas overlapping both the column electrodes 12 and the row electrodes 16 in FIG. 8A form pixels 30 that can emit light when current is passed through the light-emitting material 14 from the row electrode 16 and column electrode 12 by the column-driver chiplet 20A and row-driver chiplet 20B through the connection pads 24 and controlled by the chiplet circuitry 22 in the column-driver chiplet 20A and row-driver chiplet 20B.

The present invention can be employed in both a top-emitter configuration and in a bottom emitter configuration. However, as shown in FIGS. 8A and 8B, the chiplets (20A, 20B) are located in a layer beneath the row and column electrodes 16, 12 and occupy space over the substrate 10. Moreover, wires connect the chiplets (20A, 20B), row electrodes 12, and column electrodes 16 (not shown), occupying more space between the electrodes. Thus, a top-emitter configuration can be preferred so that the emitting area of the device is increased.

Figure 10:
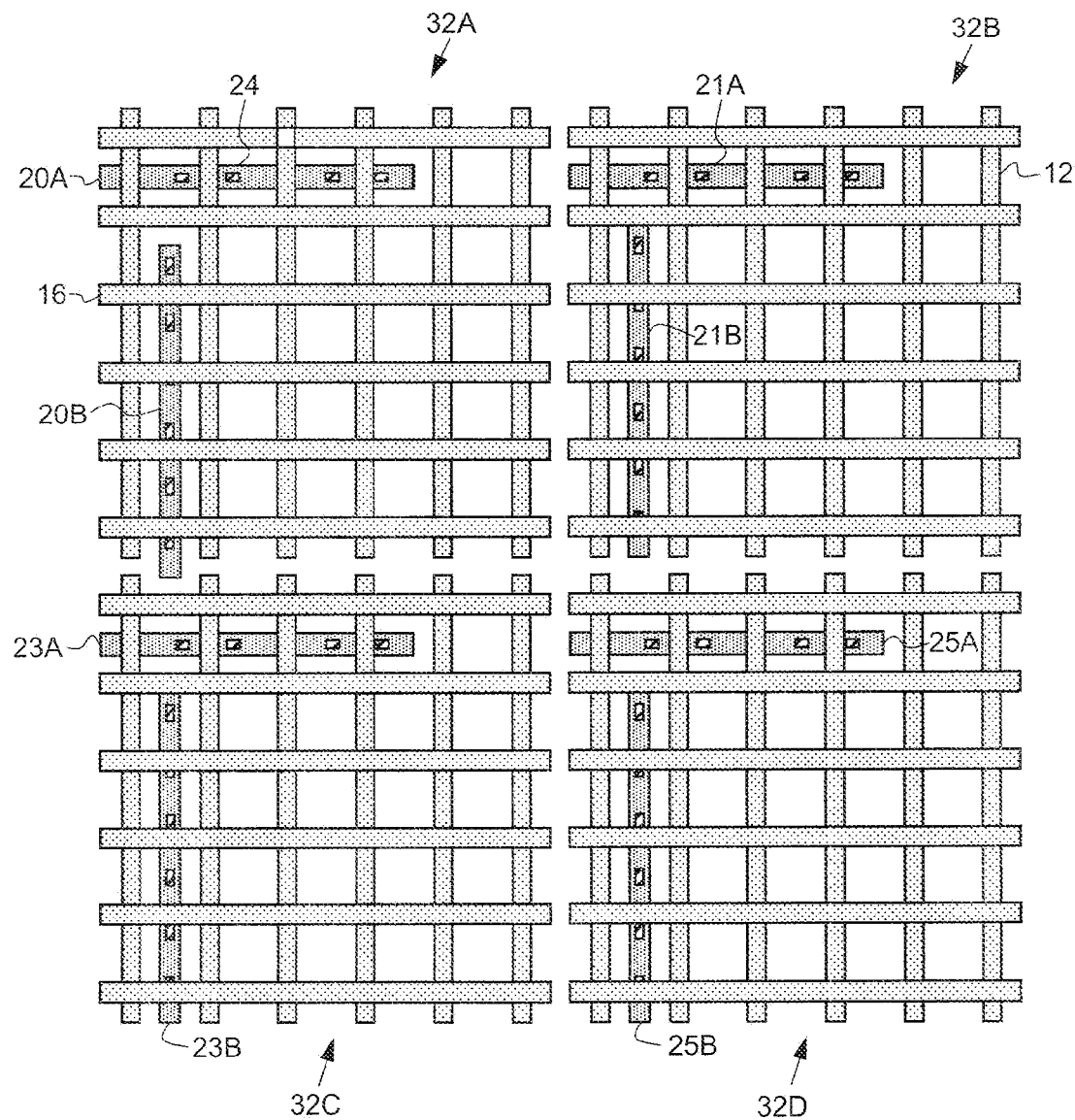
FIG. 10 is a plan view of a substrate portion with four pixel groups, group row and column electrodes, row-driver chiplets, and column-driver chiplets according to an embodiment of the present invention.

FIG. 10 is a top-view illustration of four pixel groups 32A, 32B, 32C, 32D, each pixel group having independent row electrodes 16 and column electrodes 12 and separate column-driver chiplets 20A, 21A, 23A, 25A and row-driver chiplets 20B, 21B, 23B, 25B. Chiplet connection pads 24 are indicated but not any connection wires between the chiplets (20A, 21A, 23A, 25A, 20B, 21B, 23B, 25B) or between the connection pads 24 and electrodes 16, 12. In this illustration, pixel group 32A is controlled by column-driver chiplet 20A and row-driver chiplet 20B. Pixel group 32B is controlled by driver chiplet controller 21A and row-driver chiplet 21B. Pixel group 32C is controlled by driver chiplet controller 23A and row-driver chiplet 23B. Pixel group 32D is controlled by driver chiplet controller 25A and row-driver chiplet 25B. The relative locations of the chiplets within a pixel group or over the substrate is not critical, so long as the group column electrodes are properly connected to the column-driver chiplet and the group row electrodes are properly connected to the row-driver chiplet.

In any pixel array controlled by scanning rows, flicker is a concern. Typically, passive-matrix display devices are limited to approximately 100 rows. If more rows than that are included, the drivers cannot cycle through the rows fast enough to prevent perceptible flicker. In contrast, the present invention provides advantages in that the electrode lengths are greatly reduced so that the electrodes can be controlled at a much faster rate. Furthermore, by forming separately controlled pixel groups, multiple rows can be simultaneously enabled, greatly reducing the number of rows that are sequentially driven. Therefore, using the present invention, very large pixel arrays can be constructed that provide superior image quality. Since no active-matrix thin-film transistors need to be constructed on the substrate (typically at high temperatures), manufacturing costs can be greatly reduced and a wider variety of substrate materials employed, for example flexible, plastic substrates. By arranging the chiplets as described, common busses can be connected to the chiplets within a single wiring layer.

The present invention provides reduced costs over the prior art. Conventional, active-matrix backplanes employ relatively low-performance and expensive thin-film semiconductor materials. The row-driver chiplets need not have the same number of connection pads, or the same layout of connection pads, as column-driver chiplets. Moreover, the number of rows that the row-driver chiplets drive need not be the same as the number of columns that the column-driver chiplets drive. The row driver and column-driver chiplets can be located in a wide variety of locations, so long as they are electrically connected to the corresponding row or column electrodes. Locations are generally selected to provide routing paths for electrical connections to chiplets and to space the chiplets from each other at a required positional tolerance suitable for the manufacturing process employed. Moreover, the technology, processes, or construction of row-driver chiplets can be different from the technology, processes, or construction of column-driver chiplets. By construction is meant the process limitations, materials, and manufacturing processes employed to construct the row and column-driver chiplets. For example, one chiplet can employ digital designs, processes, and materials and another analog. Alternatively, one chiplet can employ relatively high-voltage designs, processes, and materials, and another relatively low-voltage. Again, one chiplet can employ semiconductor substrate materials or doping (e.g. n- or p-doping), and another different materials or doping. The chiplets can also employ different circuit schematics.

In a further embodiment of the present invention, the chiplet connection pads can be directly connected to a row or a column electrode. However, such connections can cause the chiplets to be larger than necessary. Connection pads can be connected with wiring to the row electrodes. Vias can be employed to connect from one wiring layer to another or to connection pads and are formed between, for example the column electrodes, to avoid electrical shorts with the column electrodes. Since considerable wiring can be necessary to electrically connect the connection pads to the row and column electrodes, a top-emitter configuration can be preferred, in which the top electrode is transparent and the bottom electrode can be reflective. The substrate can also be opaque. A display device can include a plurality of row-driver chiplets and a separate plurality of column-driver chiplets distributed over the substrate in the display area.

Chiplets can have a single row or multiple rows of connection pads along the long axis of the chiplet. Circuitry in the row-driver chiplets can be different from the circuitry in the column-driver chiplets. In particular, row drivers can employ very simple circuits with lower data rates but can switch large currents compared to a column driver. Moreover, the number of rows controlled by the row-driver chiplet can be different from the number of columns driven by the column-driver chiplet. Hence different circuits can be used in the different drivers, or even different manufacturing processes or technologies employed to make the different drivers.

The chiplets can be connected to an external controller through a buss or through multiple busses (not shown in the drawings, for clarity). The buss can be a serial, parallel, or point-to-point buss and can be digital or analog. A serial buss is one in which data is re-transmitted from one chiplet to the next on electrically separated electrical connections. A parallel buss is one in which data is simultaneously broadcast to all of the chiplets on an electrically common electrical connection. A buss is connected to the chiplets to provide signals, such as power, ground, data, or select signals. More than one buss separately connected to one or more controllers can be employed.

In operation, a controller receives and processes an information signal according to the needs of the display device and transmits the processed signal and control information through one or more busses to each chiplet in the device. The processed signal includes luminance information for each light-emitting pixel element corresponding to the associated row and column-driver chiplets. The luminance information can be stored in an analog or digital storage element corresponding to each light-emitting pixel element. The chiplets then sequentially activate the row and column electrodes to which they are connected. When both the row and column electrode for a pixel is activated, current can flow through the pixel defined by the row and column electrode to emit light. Typically, a row electrode within each group of row electrodes within a pixel group are activated simultaneously by activating all of the group column electrodes and one row electrode at once (or vice versa). The column electrodes are controlled to provide the individual luminance desired for each pixel in the row. Then a second row is selected and the process repeats until all of the rows are activated and all of the pixels emit light. The process can then repeat. Separate pixel groups can function independently. Note that the designation of "row" and "column" is arbitrary and the functions and relative positions of row and column electrodes can be reversed.

Although the sequential activation of separate rows (or columns) in a display device can induce flicker, employing multiple, independently controlled pixel groups reduces the number of rows or columns in each separately controlled pixel group. Since the pixel groups are simultaneously activated, flicker can be greatly reduced. Moreover, because the group row electrodes and group column electrodes can be connected only within a pixel group, the group row electrodes and group column electrodes can be short, reducing the electrode capacitance and resistance and the need for high-power driving circuitry in the chiplets, and the power consumption of the display is reduced. Hence, the portion of time that each pixel row (or column) emits light is increased, flicker is decreased, and current densities decreased at a desired luminance.

The busses can supply a variety of signals, including timing (e.g. clock) signals, data signals, select signals, power connections, or ground connections. The signals can be analog or digital, for example digital addresses or data values. Analog data values can be supplied as charge. The storage registers can be digital (for example comprising flip-flops) or analog (for example comprising capacitors for storing charge).

The controller can be implemented as a chiplet and affixed to the substrate. The controller can be located on the periphery of the substrate or can be external to the substrate, and can be implemented in a conventional integrated circuit.

According to various embodiments of the present invention, the chiplets can be constructed in a variety of ways, for example with one or two rows of connection pads along a long dimension of a chiplet. Interconnection busses and wires can be formed from various materials and use various methods for deposition on the device substrate. For example, interconnection busses and wires can be metal, either evaporated or sputtered, for example aluminum or aluminum alloys. Alternatively, the interconnection busses and wires can be made of cured conductive inks or metal oxides. In one cost-advantaged embodiment, the interconnection busses and wires are formed in a single layer.

The present invention is particularly useful for multi-pixel device embodiments employing a large device substrate, e.g. glass, plastic, or foil, with a plurality of chiplets arranged in a regular arrangement over the device substrate. Each chiplet can control a plurality of pixels formed over the device substrate 10 according to the circuitry in the chiplet and in response to control signals. Individual pixel groups or multiple pixel groups can be located on tiled elements, which can be assembled to form the entire display.

According to the present invention, chiplets provide distributed pixel control elements over a substrate. A chiplet is a relatively small integrated circuit compared to the device substrate and includes a circuit including wires, connection pads, passive components such as resistors or capacitors, or active components such as transistors or diodes, formed on an independent substrate. Chiplets are separately manufactured from the display substrate and then applied to the display substrate. The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered a substrate separate from the device substrate and over which the chiplet circuitry is disposed. The plurality of chiplets therefore has a corresponding plurality of substrates separate from the device substrate and each other. In particular, the independent substrates are separate from the substrate on which the pixels are formed and the areas of the independent, chiplet substrates, taken together, are smaller than the device substrate. Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of the adhesive and planarization material over the chiplet that can then be applied using conventional spin-coating techniques. According to one embodiment of the present invention, chiplets formed on crystalline silicon substrates are arranged in a geometric array and adhered to a device substrate with adhesion or planarization materials. Connection pads on the surface of the chiplets are employed to connect each chiplet to signal wires, power busses and row or column electrodes to drive pixels. Chiplets can control at least four pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connection to the wiring layer provided over the chiplets once assembled onto the display substrate. The connection pads should be sized based on the feature size of the lithography tools used on the display substrate (for example 5 um) and the alignment of the chiplets to the wiring layer (for example ±5 um). Therefore, the connection pads can be, for example, 15 um wide with 5 um spaces between the pads. The pads will thus generally be significantly larger than the transistor circuitry formed in the chiplet.

The pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but also much smaller active elements (e.g. transistors), the circuitry size is much reduced. A useful chiplet can also be formed using micro-electromechanical (MEMS) structures, for example as described in "A novel use of MEMs switches in driving AMOLED", by Yoon, Lee, Yang, and Jang, Digest of Technical Papers of the Society for Information Display, 2008, 3.4, p. 13.

The device substrate can include glass and the wiring layers made of evaporated or sputtered metal or metal alloys, e.g. aluminum or silver, formed over a planarization layer (e.g. resin) patterned with photolithographic techniques known in the art. The chiplets can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to Van Slyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or bottom-emitter architecture.

The invention has been described in detail with particular reference to certain preferred embodiments thereof, but it should be understood that variations and modifications can be effected within the spirit and scope of the invention.

PARTS LIST 8A, 8A' cross section
8B, 8B' cross section
10 substrate
11 display area
12 column electrode
14 light-emitting material
15 light-emitting diode
16 row electrode
18 adhesion layer
20A column-driver chiplet
20B row-driver chiplet
21A driver chiplet controller
21B row-driver chiplet
22 circuitry
23A driver chiplet controller
23B row-driver chiplet
24 connection pad
25A driver chiplet controller
25B row-driver chiplet
28 substrate
30 pixel
32 pixel group
32A pixel group
32B pixel group
32C pixel group
32D pixel group
40A common buss
40B common buss portion
42A common buss
42B common buss portion
44 row-driver buss
46 pass-through buss
46A pass-through buss segments
46B pass-through buss segments
46C pass-through buss segments
47 chiplet connection pass-through buss
50 via
60 long axis
62 short axis
64 controller

The invention claimed is:

1. A display device, comprising:
   a) a substrate having a display area;
   b) two or more column-driver chiplets having connection pads, each column-driver chiplet having a long axis and adhered to the substrate in the display area, the long axis of each column-driver chiplet oriented in a row direction;
   c) one or more row-driver chiplets having connection pads, each row-driver chiplet having a long axis and adhered to the substrate in the display area, the long axis of each row-driver chiplet oriented in a column direction different from the row direction; and
   d) a first common power or ground bus extending over the display area in the row direction connected to a connection pad on each of the row-driver chiplets, the first common bus further including one or more electrically connected first bus portions oriented in the column direction, each first bus portion in a column direction electrically connected to a connection pad of a respective column-driver chiplet and not connected to another common power or ground bus extending in the row direction.

2. The display device of claim 1, further including row and column electrodes formed in different directions over the display area and having a light-emitting layer between the row and column electrodes where the row and column electrodes overlap defining a pixel responsive to current provided by the overlapping row and column electrodes to emit light, each column electrode electrically connected to one column-driver chiplet and each row electrode connected to at least one row-driver chiplet.

3. The display device of claim 1, wherein the row direction and the column direction are orthogonal.

4. The display device of claim 1, further including a row-driver bus extending over the display area in the row direction electrically connected to a connection pad on each of the row-driver chiplets.

5. The display device of claim 1, wherein the number of row-driver chiplets and the number of column-driver chiplets are different.

6. The display device of claim 1, wherein at least one first bus portion is electrically connected to a connection pad on each of two column-driver chiplets.

7. The display device of claim 1, further including a second common bus extending over the display area in the row direction connected to one of the connection pads on each of the row-driver chiplets, the second common bus further including one or more electrically connected second bus portions oriented in the column direction, each second bus portion in the column direction electrically connected to one of the connection pads of each of the column-driver chiplets from a side of the column-driver chiplet opposite to the side of the column-driver chiplet to which the first bus portion in the column direction is connected.

8. The display device of claim 7, wherein the first common bus and the second common bus are formed in a single layer.

9. The display device of claim 7, wherein at least one second bus portion is electrically connected to a connection pad on each of two column-driver chiplets.

10. The display device of claim 7, further including a central connection pad on one of the row-driver chiplets and wherein either the first common bus or the second common bus is electrically connected to the central connection pad.

11. The display device of claim 1, further comprising a first pass-through bus that electrically connects to one of the column-driver chiplets at a first one of the connection pads, passes through the column-driver chiplet and electrically connects to a second one of the connection pads of the column-driver chiplet, wherein the first pass-through bus is connected to one of the row-driver chiplets.

12. The display device of claim 1, further comprising a second pass-through bus that electrically connects to one of the row-driver chiplets at a first one of the connection pads, passes through the row-driver chiplet and electrically connects to a second one of the connection pads of the row-driver chiplet, wherein the second pass-through bus passes over or under one of the column-driver chiplets to electrically connect to a connection pad on one of the row-driver chiplets.

13. The display device of claim 12, wherein the second pass-through bus is electrically connected to one of the column-driver chiplets.

14. The display device of claim 1, further comprising a plurality of pixel groups including pixels and wherein each pixel group is laid out in the display area as a mirror image of a neighboring pixel group in the row direction, the column direction, or both the row and the column directions.

15. The display device of claim 1, wherein the first common bus passes over or under each of the row-driver chiplets in the row direction.

16. A display device, comprising:
a) a substrate having a display area;
b) two or more column-driver chiplets having connection pads, each column-driver chiplet having a long axis and adhered to the substrate in the display area, the long axis of each column-driver chiplet oriented in a row direction;
c) one or more row-driver chiplets having connection pads, each row-driver chiplet having a long axis and adhered to the substrate in the display area, the long axis of each row-driver chiplet oriented in a column direction different from the row direction;
d) a first common power or ground bus extending over the display area in the row direction connected to a connection pad on each of the row-driver chiplets, the first common bus further including one or more electrically connected first bus portions oriented in the column direction, each first bus portion electrically connected to a connection pad of a respective column-driver chiplet;
e) a second common bus extending over the display area in the row direction connected to one of the connection pads on each of the row-driver chiplets, the second common bus further including one or more electrically connected second bus portions oriented in the column direction, each second bus portion electrically connected to one of the connection pads of each of the column-driver chiplets from a side of the column-driver chiplet opposite to the side of the column-driver chiplet to which the first bus portion is connected; and
f) a row-driver chiplet buss extending over the display area in the row direction located between the first and second common busses, the row-driver chiplet buss electrically connected to the row-driver chiplets in the display area.

17. The display device of claim 16, further including a central connection pad on one of the row-driver chiplets and wherein the row-driver chiplet bus, the first common bus, or the second common bus is electrically connected to the central connection pad.

* * * * *